United States Patent
Bertin et al.

(10) Patent No.: US 6,531,410 B2
(45) Date of Patent: Mar. 11, 2003

(54) INTRINSIC DUAL GATE OXIDE MOSFET USING A DAMASCENE GATE PROCESS

(75) Inventors: Claude Louis Bertin, South Burlington, VT (US); Anthony J. Dally, Boise, ID (US); John Atkinson Fifield, Underhill, VT (US); John Jesse Higgins, Essex Junction, VT (US); Jack Allan Mandelman, Stormville, NY (US); William Robert Tonti, Essex Junction, VT (US); Nicholas Martin van Heel, Eagle, ID (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,610

(22) Filed: Feb. 27, 2001

(65) Prior Publication Data

US 2002/0119637 A1 Aug. 29, 2002

(51) Int. Cl.$^7$ .................. H01L 21/31; H01L 21/469
(52) U.S. Cl. ............... 438/766; 438/197; 438/299; 438/528; 438/585; 438/770
(58) Field of Search .................. 438/197, 283, 438/286, 287, 299, 528, 561, 563, 558, 585, 981, 765, 766, 770

(56) References Cited

U.S. PATENT DOCUMENTS

| 5,504,039 A | | 4/1996 | Grivna |
|---|---|---|---|
| 5,789,320 A | | 8/1998 | Andricacos et al. |
| 5,886,411 A | | 3/1999 | Kohyama |
| 5,940,735 A | | 8/1999 | Mehta et al. |
| 5,966,597 A | | 10/1999 | Wright |
| 5,985,726 A | | 11/1999 | Yu et al. |
| 6,077,749 A | * | 6/2000 | Gardner et al. ............. 438/299 |
| 6,136,674 A | * | 10/2000 | An et al. ..................... 438/585 |
| 6,225,669 B1 | * | 5/2001 | Long et al. .................. 257/401 |
| 6,348,385 B1 | * | 2/2002 | Cha et al. .................... 438/287 |
| 6,380,102 B1 | * | 4/2002 | Oh .............................. 438/771 |

* cited by examiner

Primary Examiner—Matthew Smith
Assistant Examiner—Craig P. Lytle
(74) Attorney, Agent, or Firm—Scully, Scott, Murphy & Presser; Lawrence R. Fraley, Esq.

(57) ABSTRACT

Damascene or non-damascene processing when used with a method that includes (a) forming a mask having an opening therethrough on a structure, said opening having sidewalls; (b) implanting an inhibiting species into said structure through the opening so as to form an inhibiting region in said structure; and (c) growing a dielectric layer on the structure in said opening, wherein the inhibiting region partially inhibits growth of the dielectric layer is capable of forming a semiconductor structure, e.g., MOSFET or anti-fuse, including a dual thickness dielectric layer. Alternatively, the dual thickness dielectric can be formed by replacing the inhibiting species mentioned above with a dielectric growth enhancement species which forms an enhancing region in the structure which aids in the growth of the dielectric layer.

21 Claims, 10 Drawing Sheets

INTRINSIC DUAL GATE OXIDE MOSFET USING A DAMASCENE GATE PROCESS

FIELD OF THE INVENTION

The present invention relates to semiconductor device manufacturing, and in particular to methods for forming semiconductor devices such as metal oxide semiconductor field effect transistors (MOSFETs) and anti-fuses which include at least a dual thickness dielectric layer.

BACKGROUND OF THE INVENTION

In current technologies, the threshold voltage of semiconductor devices does not scale with the power supply voltage and ground rules because of the non-scalability of the sub-threshold slope. Thus, the minimum gate oxide thickness and/or maximum wordline boost voltage of the array MOSFET is constrained by reliability considerations.

When used for the support MOSFET, the relatively thick gate oxide (having a thickness of greater than ≈6 nm for deep sub-$\mu$m technology) required by the array MOSFET results in degradation in the performance of the MOSFET device. Furthermore, if a thinner gate oxide is used to improve the performance of the support circuitry, charge transfer efficiency in the device array is compromised as a result of the reliability limitation of the wordline boost voltage.

Ideally, in such technology, a dual gate oxide thickness is desired. In the prior art, it is known to subject the array transistor to a dual gate oxidation process or an alternative gate oxidation process as compared to the support circuitry. These additional gate oxidation processing steps are costly, and they are also yield limiting since one must utilize additional processing steps such as, but not limited to: masking, exposure, etching, oxidizing and strip masking, which grow a second oxide on the entire structure of the MOSFET device. As such, prior art gate oxidation processes are not reliable nor cost efficient.

In view of the drawbacks mentioned above with prior art processes of fabricating MOSFETs, there is a continued need for providing a new and improved method of fabricating a MOSFET and other devices in which a dielectric layer, e.g., gate oxide, having a dual thickness can be formed without adding extra processing steps and costs to the overall manufacturing process.

SUMMARY OF THE INVENTION

One object of the present invention is to provide a self-aligned MOSFET having low overlap capacitance, and a low gate induced drain leakage (i.e., low electric field), with thin oxide MOSFET properties.

Another object of the present invention is to provide a method of forming a structure having lightly doped source/drain diffusion regions that are self-aligned with the step in the gate dielectric thickness. The term "step" is used herein to denote the region in the gate dielectric wherein an abrupt change in dielectric thickness occurs.

A further object of the present invention is to provide an anti-fuse device in which significantly lower dielectric rupture voltages can be employed than heretofore possible with prior art anti-fuse devices.

An even further object of the present invention is to provide an anti-fuse device in which the programming region of the device is tailored made.

The above objects and advantages are achieved in one embodiment of the present invention by implanting an inhibiting species into predetermined regions of a semiconductor structure, whereby said inhibiting species retards the growth of a gate dielectric so as to form discrete dielectric regions having different thicknesses.

Specifically, in this embodiment of the present invention, the method comprises the steps of:
  (a) forming a mask having an opening therethrough on a structure, said opening having sidewalls;
  (b) implanting an inhibiting species into said structure through the opening so as to form an inhibiting region in said structure; and
  (c) growing a dual thickness dielectric layer on the structure in said opening, wherein the inhibiting region partially inhibits growth of the dielectric layer.

The above-mentioned basic processing steps can be used in conjunction with or without sacrificial sidewall spacers formed in the opening, and with or without a sacrificial oxide layer formed in the opening. The above-mentioned processing steps may also be used in conjunction with a conventional damascene processing scheme or, alternatively, in conjunction with a non-damascene processing scheme.

Damascene processing is employed in the present invention in fabricating MOSFETs that have minium device geometry. Non-damascene processing, while being capable of forming MOSFETs, is limited to larger devices than which can be fabricated by damascene processing. Moreover, the non-damascene technique permits the formation-of anti-fuse devices that contain the dual thickness dielectric layer as the anti-fuse material.

Alternatively, the dual thickness dielectric may be obtained utilizing the following processing steps:
  (a') forming a mask having an opening therethrough on a structure, said opening having sidewalls;
  (b') implanting a dielectric growth enhancement species into said structure through the opening so as to form an enhancing region in said structure; and
  (c') growing a dual thickness dielectric layer on the structure in said opening, wherein the enhancing region partially aids in growth of the dielectric layer.

This alternative embodiment of the present invention may be used with or without sacrificial sidewall spacers; without or without a sacrificial oxide layer; in conjunction with a damascene processing scheme; or in conjunction with a non-damascene processing scheme.

Notwithstanding which method is employed, the present invention also comprises a semiconductor device which includes a dual thickness dielectric as either the gate oxide of a MOSFET or as an anti-fuse material. Specifically, the semiconductor device of the present invention comprises:
  a semiconductor substrate having a gate region formed thereon, wherein said semiconductor substrate and said gate region are separated by a dielectric that has a dual thickness associated therewith.

In one embodiment of the present invention, the structure contains lightly doped source/drain diffusion regions that are self-aligned with the step segment in the dual thickness dialectic.

DETAILED DESCRIPTION OF THE INVENTION

Figure 1:
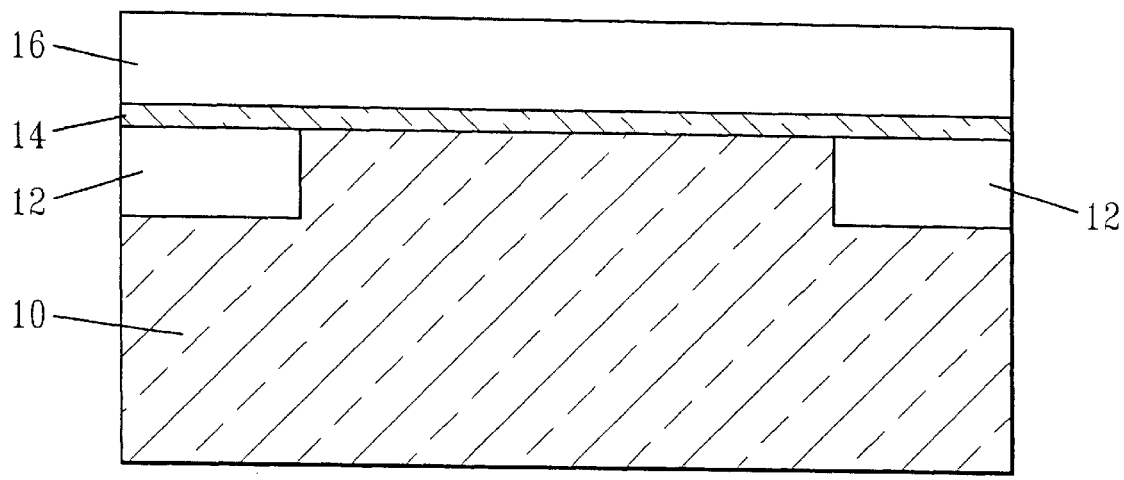
FIGS. 1–7 are pictorial views illustrating the basic processing steps employed in a first embodiment of the present invention.

The present invention which provides methods for forming a dielectric layer having dual thicknesses will now be described in more detail by referring to the drawings that accompany the present application. It is noted that in the accompanying drawings, like and/or corresponding elements are referred to by like reference numerals.

Damascene Embodiments

Reference is first made to FIGS. 1–7 which illustrate a first embodiment of the present invention wherein method steps (a)–(c) mentioned above are used in conjunction with a damascene processing scheme. Specifically, FIG. 1 shows an initial structure that can be employed in the present invention. The illustrated structure includes semiconductor substrate 10, isolation regions 12, oxide layer 14, and hard mask 16. The structure shown in FIG. 1 is fabricated using conventional processing techniques well known in the art and it is composed of conventional materials that are also well known in the art.

For example, semiconductor substrate 10 comprises any semiconducting material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs) are also contemplated herein. The substrate may be of the n or p-type depending on the desired device to be fabricated.

Each isolation region 12 is composed of an insulating material such as $SiO_2$ and each isolation region may be lined with a conventional liner material. The opening for each isolation region is formed by conventional lithography and etching such as reactive-ion ecthing (RIE) and the insulating material is formed in the opening by any conventional deposition process such as chemical vapor deposition (CVD), plasma-assisted CVD, sputtering, reactive-sputtering and other like deposition processes. Following deposition of the insulating material, a conventional planarization process such as chemical-mechanical polishing (CMP) or grinding may be employed.

Although trench isolation regions are depicted, the present invention is not limited to structures which include the same. Instead, the trench isolation regions may be replaced by LOCOS (local oxidation of silicon) regions or other like isolation regions which are well known to those skilled in the art. In some embodiments of the present invention, especially those involving anti-fuse devices, no isolation regions need be present in the structure.

Next, oxide layer 14 is formed on the surface of semiconductor substrate 10 utilizing a conventional deposition process such as CVD, plasma-assisted CVD, evaporation or sputtering. Alternatively, oxide layer 14 may be formed by utilizing a conventional thermal growing process. The oxide layer is typically composed of $SiO_2$ and its thickness is from about 2 to about 200 nm, with a thickness of from about 10 to about 20 nm being more preferred.

Hard mask 16 is formed on oxide layer 14 utilizing a conventional deposition process such as CVD, plasma-assisted CVD, sputtering, evaporation and other like deposition processes. The hard mask is composed of SiN, $SiO_xN_y$, or other like materials that are capable of acting as a hard mask as well as a polish stop layer. The thickness of the hard mask is not critical to the present invention, but typically the hard mask has a thickness of from about 50 to about 400 nm.

Next, a conventional photoresist mask 18 is formed on the hard mask using a conventional deposition process such as spin-on coating, CVD, plasma-assisted CVD, evaporation and other like deposition processes. The photoresist mask is patterned utilizing conventional lithography including resist exposure and development.

Figure 2:
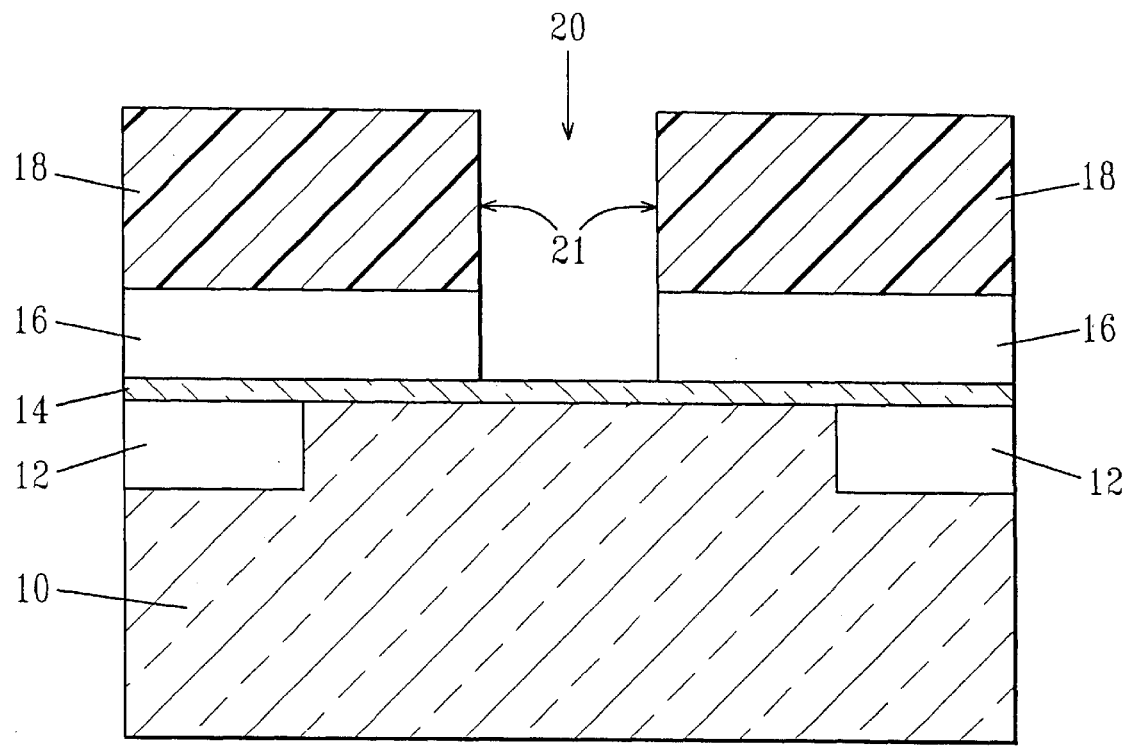
Figure 3:
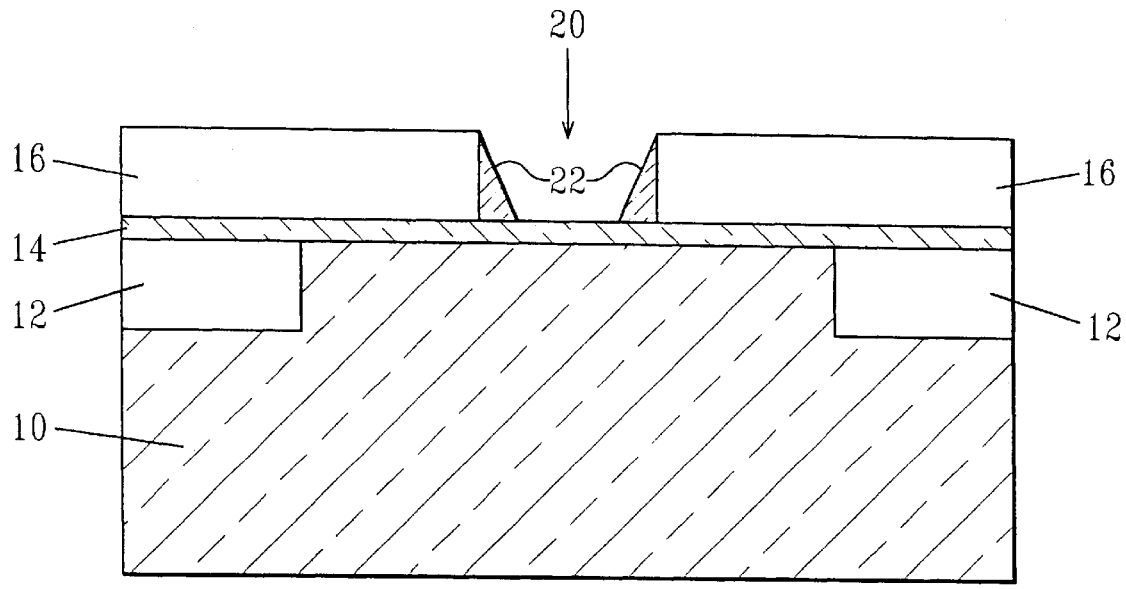
Figure 8:
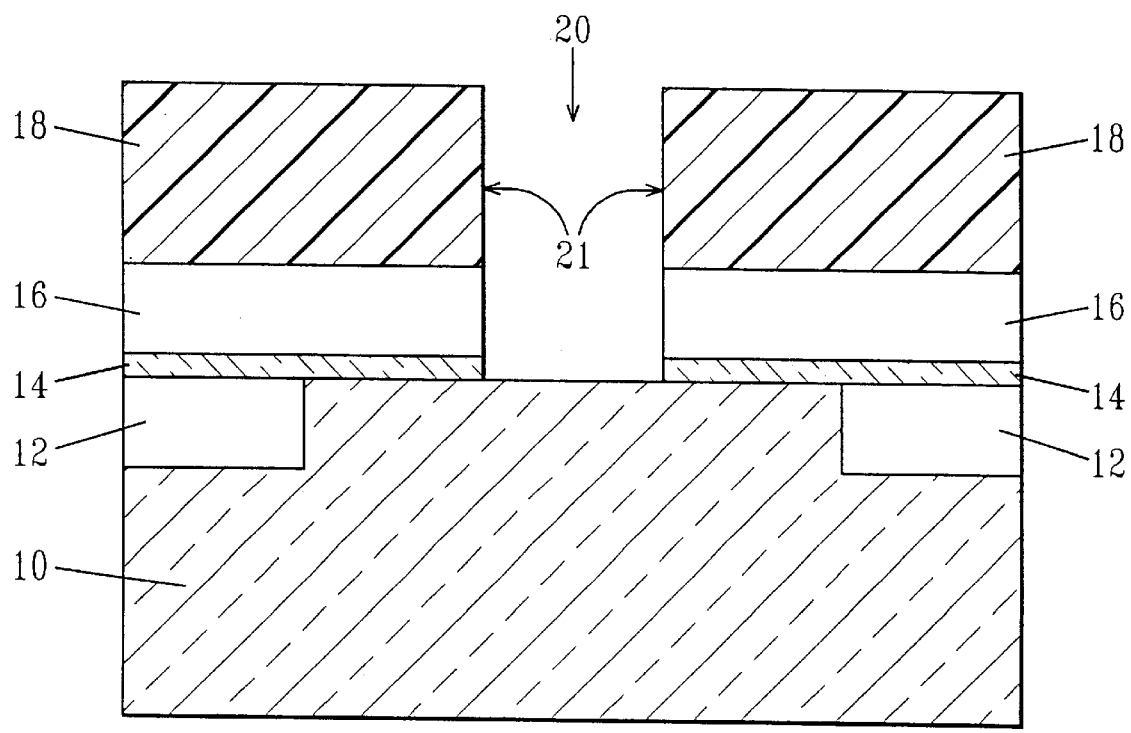
FIGS. 8–13 are pictorial views illustrating the basic processing steps employed in a variation to the first embodiment of the present invention.

Next, opening 20 having substantially vertical sidewalls 21 is formed in the structure shown in FIG. 1 using the patterned photoresist. The opening is formed by any conventional dry etching process such as RIE, ion-beam etching, plasma-etching or any combinations thereof. In one embodiment and as shown in FIG. 2, this etching step may stop on oxide layer 14. Alternatively, and as shown in FIG. 8, this etching step may stop on a surface of semiconductor substrate 10. It should be noted that although only one opening is depicted in the drawings of the present invention, the various methods of the present invention work well when a plurality of openings are formed in the structure.

At this point in the present invention, an optional well implant region (not shown in the drawings) may be formed by utilizing conventional ion implantation and activation annealing. The photoresist may be removed after etching or after the optional well implant has been performed.

Next, optional sacrificial sidewall spacers 22 which may be composed of an oxide, an oxynitride, a nitride, or a doped glass such as phosphorus silicate glass (PSG), boron phosphorus silicate glass (BPSG) or arsenic silicate glass (ASG) may be formed in opening 20 on substantially vertical sidewalls 21. The optional sacrificial sidewall spacers may be formed on both substantially vertical sidewalls (See FIG. 3), on only one substantially vertical sidewall or neither vertical sidewall. The latter two alternatives are not shown in the drawings of the present invention, but the basic concepts thereof can be understood from the various drawings depicted herein. The use of sacrificial spacers is highly preferred in the present invention since these spacers serve as an implant screen for the subsequent implant process.

Figure 9:
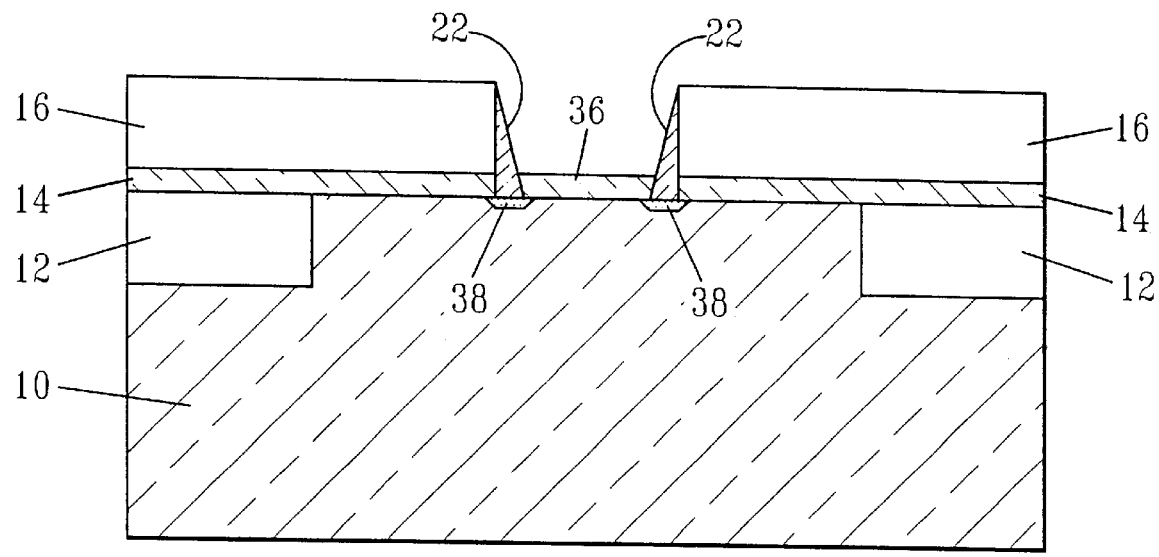
Figure 10:
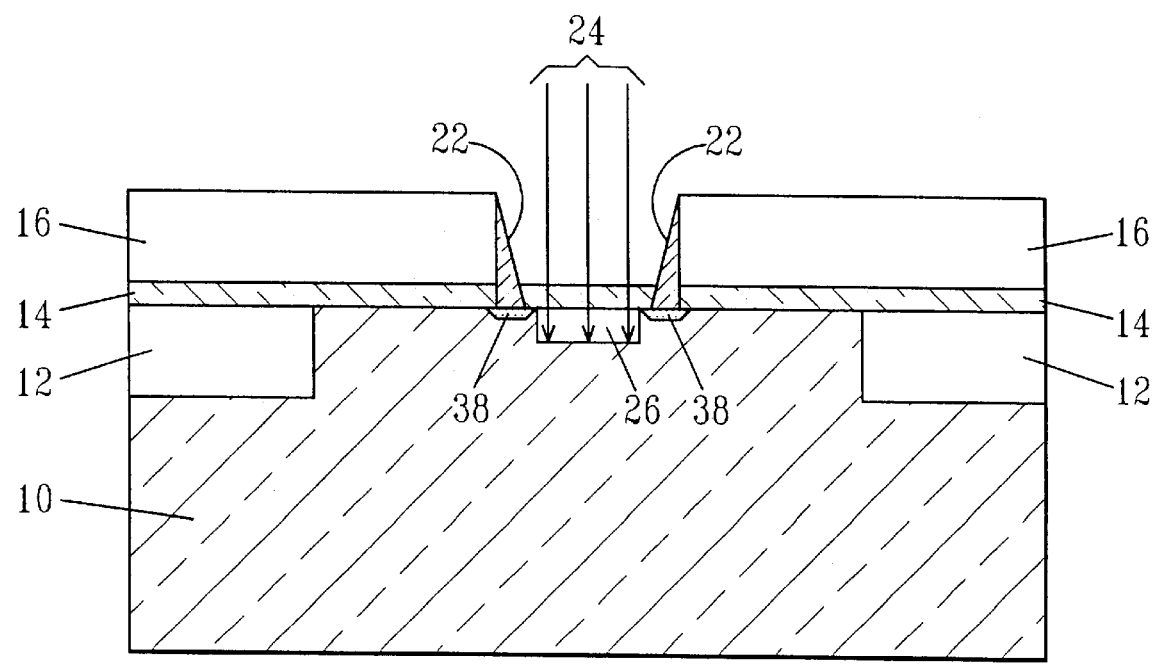
Figure 11:
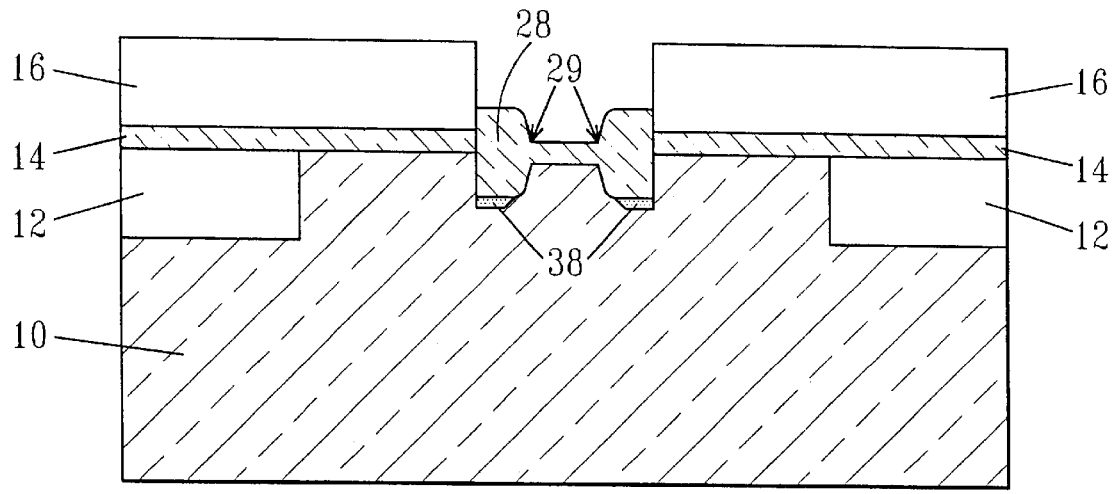
Figure 12:
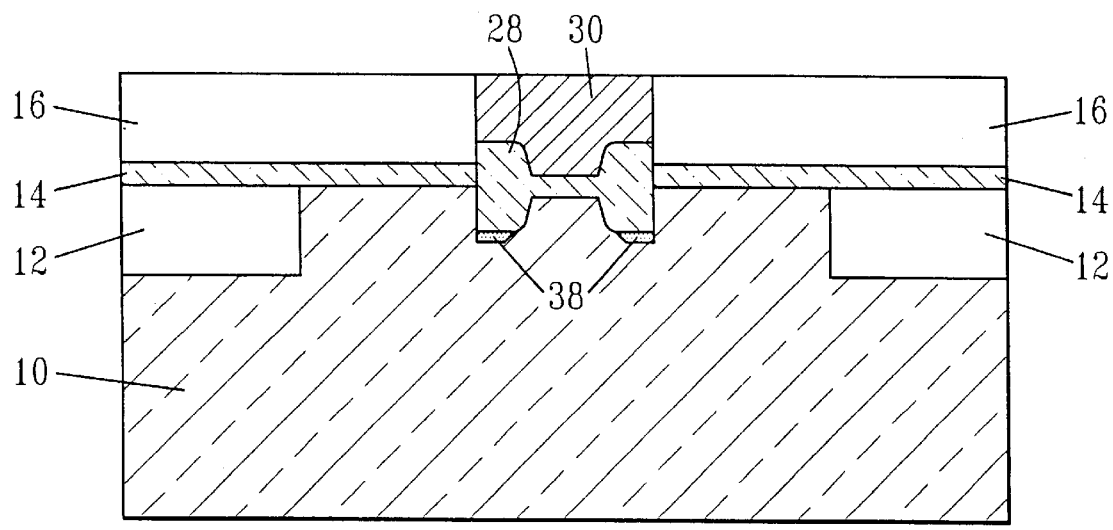
Figure 13:
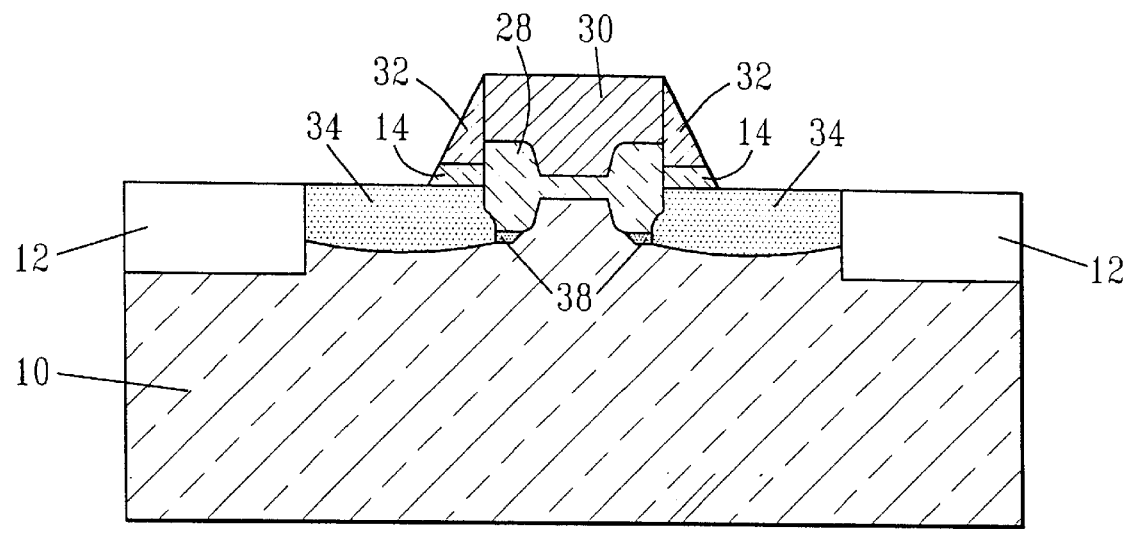

It is noted that sacrificial spacers composed of a doped glass material are used in forming a predoped region in the semiconductor substrate, See FIG. 9 in this regard.

The optional sacrificial sidewall spacers are formed utilizing a conventional deposition process such as CVD, plasma-assisted CVD, evaporation, sputtering, or chemical solution deposition and thereafter a conventional dry etch process, as mentioned above, is used in forming the desired spacer shape.

Figure 4:
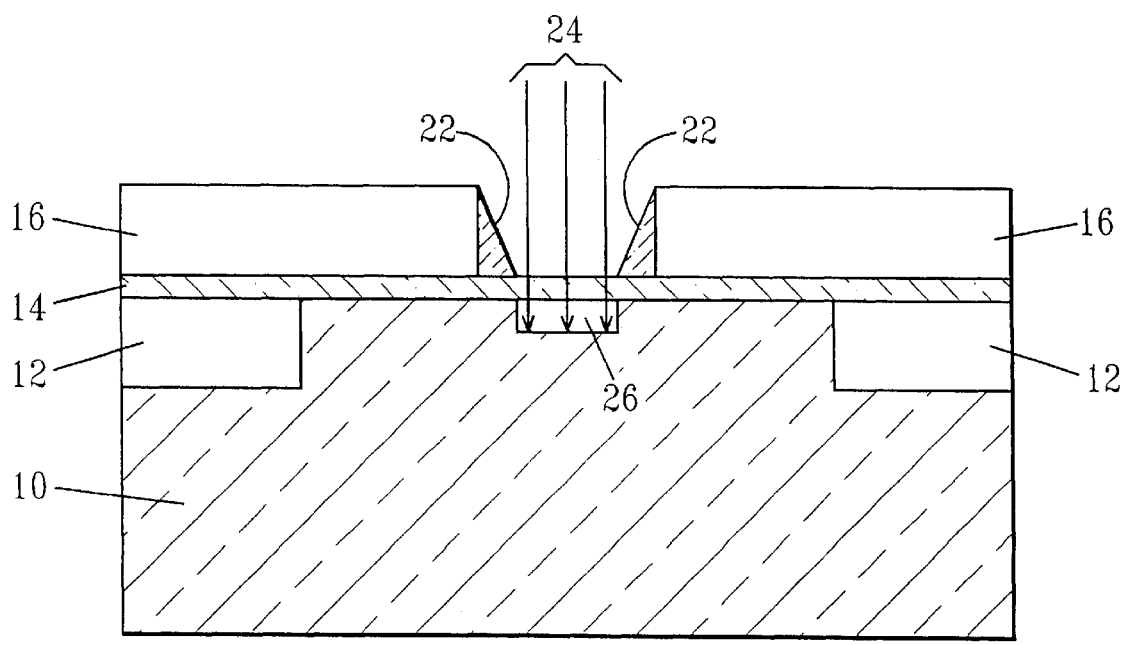

Next, as shown in FIG. 4, an inhibiting species 24 such as nitrogen and other like species that are capable of retarding growth of a dielectric layer are implanted into the substrate using conventional ion implantation so as to form inhibiting region 26 therein. Typically, nitrogen is used in this step of the present invention and the implant is carried out using an ion dosage of from about $1 \times 10^{14}$ to about $1 \times 10^{15}$ atoms/cm$^2$ at an energy range of from about 10 to about 30 keV. The above conditions which are dependent on layer 14 are exemplary and by no way limit the scope of the present invention.

Other ion implantation conditions that are capable of forming an inhibiting region in the substrate are thus also contemplated herein.

Alternatively, instead of using an inhibiting species at this point of the present invention, a species that enhances the formation of the dielectric (i.e., "dielectric growth enhancement species") may be implanted so as to form a dielectric growth enhancing region in the substrate which aids in the growth of the dielectric layer. When such an alternative embodiment is employed, the region containing the dielectric growth enhancement agent will provide a thicker dielectric as compared to regions that do not contain the same. This effect is opposite to the effect illustrated in the drawings of the present invention wherein a thinner dielectric region is formed in areas containing the inhibiting species. For clarity, this alternative embodiment is not illustrated in the drawings, however the final structure obtained would be similar to the ones depicted in the present invention.

When the alternative embodiment is employed, a growth enhancement species, which could also be labeled as 24, such as oxygen, argon and other like species that are capable of enhancing the growth of a dielectric layer are implanted into the substrate using conventional ion implantation so as to form an enhancing region (which could also be designated as 26) therein. Typically, oxygen is used in this alternative step of the present invention and the implant is carried out using an ion dosage of from about $1 \times 10^{14}$ to about $1 \times 10^{16}$ atoms/cm$^2$ at an energy range of from about 10 to about 35 keV. As before, these conditions are also exemplary and by no way limit the scope of the present invention.

For the sake of brevity, the description that follows will make reference only to the inhibiting species and region with the understanding however that the alternative embodiment mentioned above is also applicable. Again, the effect of the alternative embodiment is opposite to the one depicted in the drawings, i.e., the presence of the enhancing region causes the formation of a dielectric that is thicker than in regions which do not contain the same.

It should be noted that by using the above mentioned sacrificial sidewall spacers one can tailor where the inhibiting region is formed in the substrate. For example, when two sacrificial spacers are present in the opening, the inhibiting region is formed substantially in the center of the opening. Thus, when the subsequent dielectric layer is grown in such a structure, the center region will contain a dielectric that is thinner than the abutting end regions which include the sacrificial spacers. Likewise, when only one sacrificial spacer is present, the inhibiting region is formed in an area abutting the sacrificial spacer and that area will contain a thinner dielectric than the remaining regions which include the spacer. When no sacrificial spacers are present, tailoring of the dual thickness dielectric may be achieved utilizing a masked ion implantation process. Alternatively, when no sacrificial sidewall spacers are employed, tailoring may be had by using both the inhibiting species and the enhancement species, and by implanting each species into different regions in the opening.

Following the formation of the inhibiting region in the substrate, the optional sacrificial spacers and the oxide layer in the opening are stripped utilizing an etching process that is highly selective in removing these regions so as to expose the underlying substrate. Specifically, the etching process used in the step of the present invention may include any dry etching process, wet chemical etching process or a combination thereof. The optional sacrificial spacers and oxide layer in the opening may be removed at the same time using a single etching process, or these regions may be removed at different times utilizing a combination of the same or different etching processes. Alternatively, a chemical-down stream etching (CDE) process may be used in forming the sacrificial spacers and the oxide layer.

Figure 5:
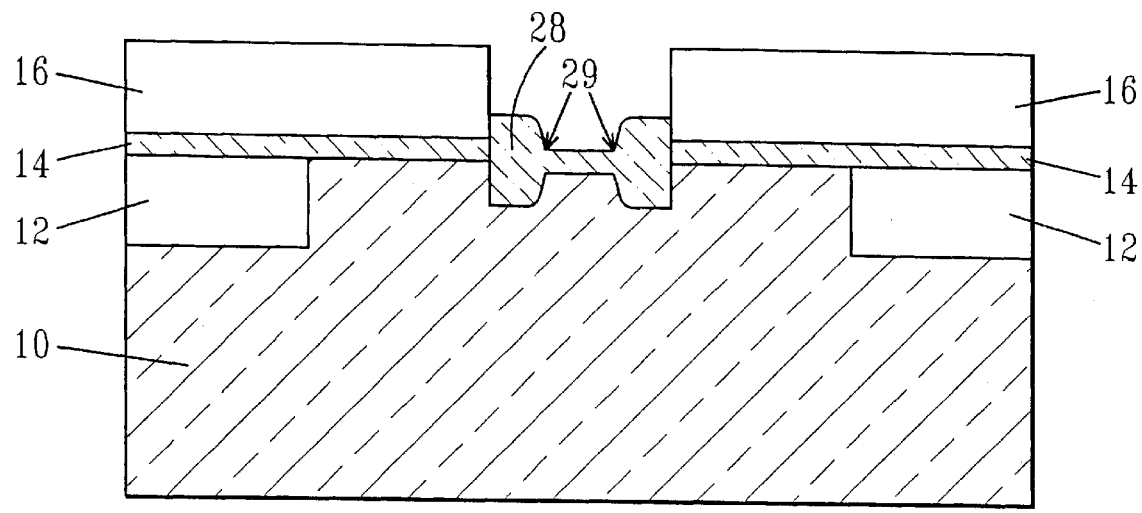

Next, as shown in FIG. 5, dielectric layer 28 is grown in the opening on the exposed portions of the substrate utilizing a conventional growing process such as a gate oxidation process. As shown in FIG. 5, dielectric layer 28 will also be formed in part of the substrate. Because of the presence of the inhibiting region previously formed in the substrate, the dielectric that is grown in areas overlaying the inhibiting region is thinner than in areas that do not contain the inhibiting region; the opposite effect is observed when an enhancement species is employed.

The dielectric that is grown is typically composed of an oxide such as SiO$_2$ and reference numeral 29 is used in defining the step segment(s) which signifies the region in dielectric layer 28 wherein an abrupt change in thickness is first observed.

Typically, the dielectric layer is grown by heating the structure in the presence of an oxidizing ambient such as O$_2$, ozone, or NO at a temperature of from about 800° to about 1100° C. for a time period of about from 100 seconds to about 20 minutes. Other temperatures and times may also be employed in the present invention so long as they are capable of growing dielectric layer 28.

Figure 6:
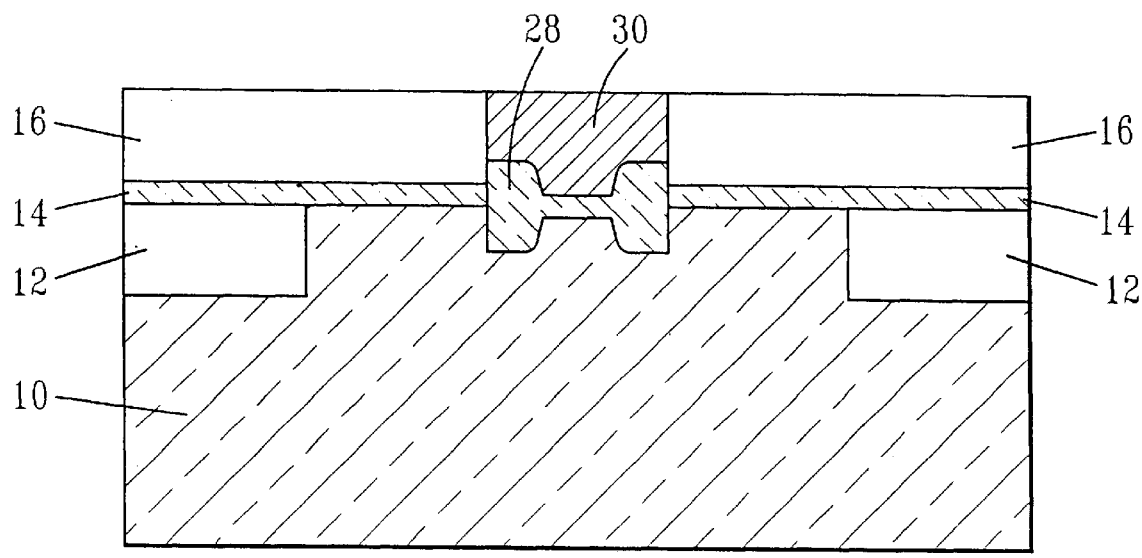

Next, as shown in FIG. 6, the opening is filled with a conductive material 30 utilizing any conventional deposition process including, but not limited to: CVD, plasma-assisted CVD, sputtering, evaporation, plating (electro- and electroless), reactive-sputtering, chemical solution deposition and other like deposition processes.

The conductive material used in this step of the present invention includes: polysilicon, conductive metals such as W, Pt, Au, Ag, Co and Ti, metallic silicides such as WSi$_x$, TiSi$_x$, or CoSi$_x$, metallic nitrides, or any combination thereof: for example, a multilayer comprising polysilicon and a conductive metal or metallic silicide may be used. It should be noted that when MOSFETs are formed, the substrate may be, but not necessarily, a different conductivity type than the conductive material. In the case of anti-fuse devices, the substrate and the conductive material may be, but not necessarily, formed of the same conductivity type material, i.e., n-type or p-type materials.

An optional capping layer (not shown in the drawings of the present invention) composed of SiN or TiN may be formed by conventional deposition processes on the exposed top layer of conductive material 30.

Following deposition of the conductive material into the opening, a conventional planarization process such as CMP may be employed to provide the planar structure illustrated in FIG. 6.

Figure 7:
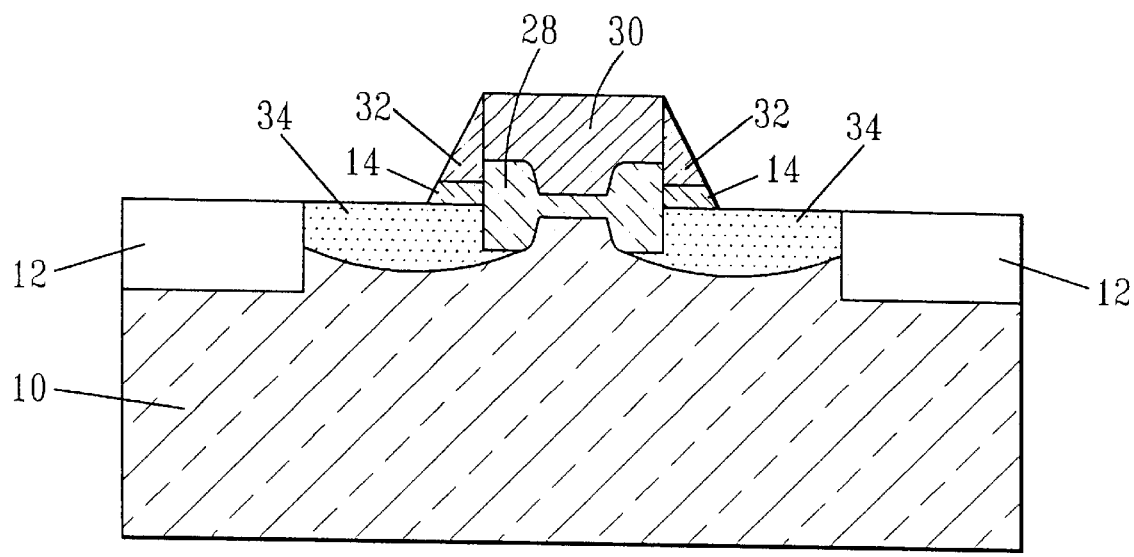

FIG. 7 illustrates the MOSFET structure that is formed after conducting a conventional damascene etch back process in which hard mask 16 abutting the dielectric layer and conductive material (hereinafter referred to as the gate region) is removed. The damascene etch back process employed in the present invention utilizes a chemical etchant that is highly selective for removing hard mask material as compared to the surrounding materials.

Spacers 32 are formed on the exterior sidewalls on the gate region utilizing the same process as used in forming the sacrificial sidewall spacers. Thus, CVD and RIE can be employed in forming spacers 32. It is also possible to form spacers 32 by a directional deposition process. The spacers used in the step of the present invention may be comprised of a nitride, an oxynitride or an oxide. In anti-fuse devices, spacers 32 may be omitted.

Next, any oxide layer 14 surrounding the gate region not covered by spacers 32 is removed utilizing an etching process that is highly selective in removing oxide as compared to the surrounding materials present in the structure.

Following formation of the spacers and removal of the oxide layer surrounding the gate region, diffusion regions 34 having different conductivities are formed in the substrate utilizing conventional ion implantation and activation annealing. As shown, the diffusion regions are self-aligned with the step segments in the dielectric layer.

The above description and FIGS. 1–7 illustrate one possible embodiment of the present invention, the following description which makes reference to FIGS. 8–13 shows a variation to the embodiment illustrated above.

FIG. 8 illustrates a structure that is used in this alternative embodiment of the present invention. Specifically, the structure shown in FIG. 8 includes substrate 10, isolation regions 12, oxide layer 14, hard mask 16, patterned photoresist 18, and opening 20 that extends to the surface of substrate 10.

The structure shown in FIG. 8 is fabricated utilizing the same processing steps as described hereinabove in providing the structure shown in FIGS. 1–2, except that etching removes both the hard mask and the oxide layer.

The patterned photoresist is removed and thereafter sacrificial spacers 22 composed of doped silicate glass (See FIG. 9) are formed in opening 20 using a conventional deposition and etching process. A sacrificial oxide layer 36 (See FIG. 9) is then formed in the opening on the surface of the substrate not containing the doped silicate glass spacers using the same or different processes as was used in forming oxide layer 14. When a sacrificial oxide layer is formed in the opening, it may have the same or different thickness as oxide layer 14.

Following the formation of the sacrificial oxide layer, the dopant within the doped spacers are driven into the substrate using any conventional annealing process that is capable of driving-in and activating the dopant so as to form predoped regions 38 (See FIG. 9) in the structure. As illustrated in FIG. 9, the predoped regions are contained substantially within the regions of the substrate that are beneath the doped spacers.

FIGS. 10–13 show the structure through various processing steps that are equivalent to those described above in regard to FIGS. 4–7; therefore no further description of the various processing steps are necessary. It is noted that in this embodiment, it is also possible to use only one doped silicate glass spacer. When the embodiment shown in FIGS. 8–13 is employed the diffusion regions are self-aligned to the step segment in the dielectric layer.

Non-damascene Embodiments

Figure 14:
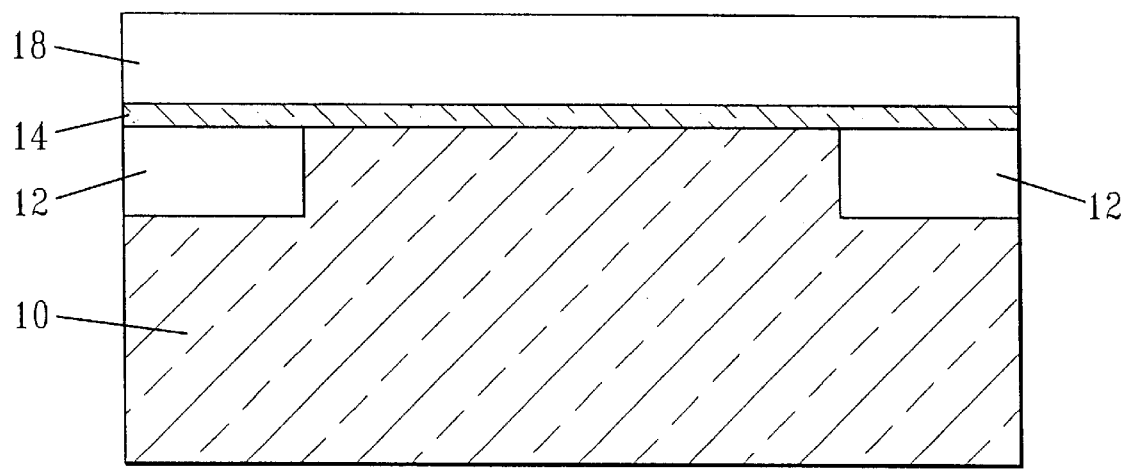
FIGS. 14–19 are pictorial views illustrating the basic processing steps used in a second embodiment of the present invention.

In addition to the damascene embodiments mentioned above, the method of the present invention can also be implemented with non-damascene embodiments. In the non-damascene embodiments, the initial structure employed is shown in FIG. 14. Specifically, the structure shown in FIG. 14 includes semiconductor substrate 10, isolation regions 12, and oxide layer 14. No hard mask is employed in the non-damascene embodiments.

Figure 15:
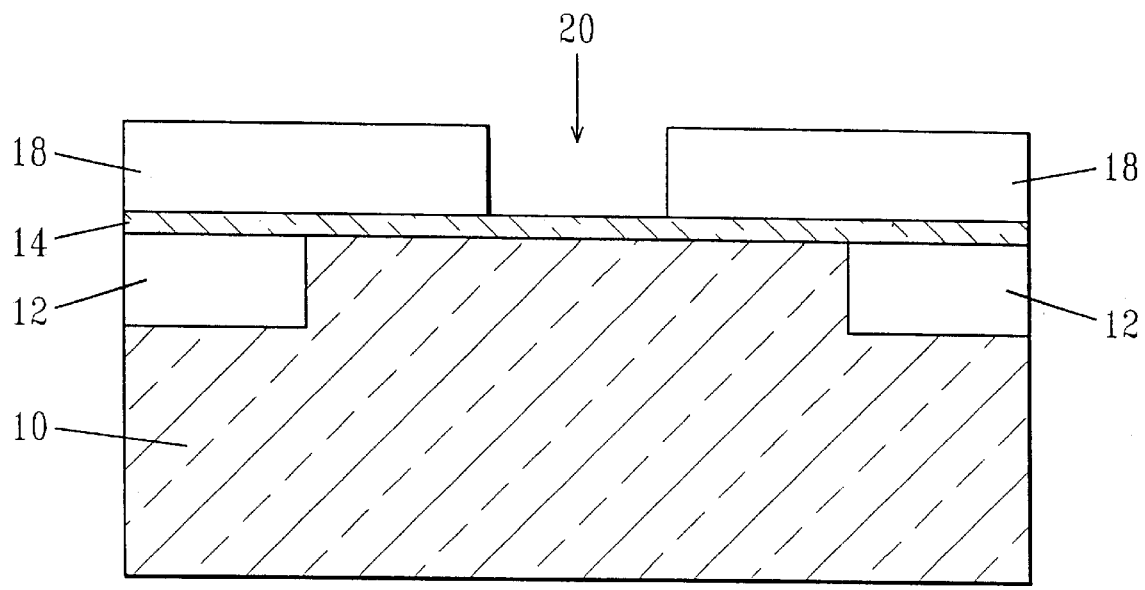

Next, as shown in FIGS. 14–15, photoresist mask 18 is formed on the oxide layer and the mask is patterned by conventional lithography. Opening 20 which extends to a top surface of oxide layer 14 is formed in the patterned photoresist by RIE or another like dry etching processes.

Figure 16:
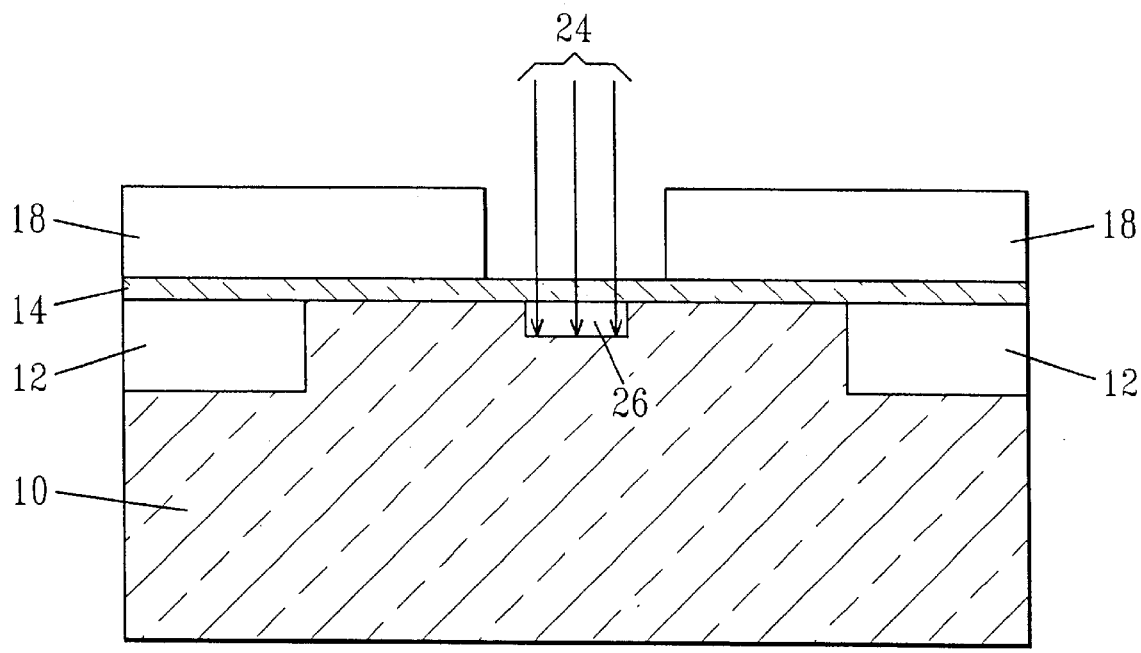

Following the formation of opening 20 and optionally the sacrificial spacers (not shown here for clarity) in the structure, inhibiting species 24 is implanted as described above so as to provide inhibiting region 26 in the structure. This step of the present invention is shown in FIG. 16. As in the previous embodiment, the inhibiting species may be replaced with a dielectric growth enhancement species which forms an enhancing region in the substrate that aids in the growth of the dielectric.

Figure 17:
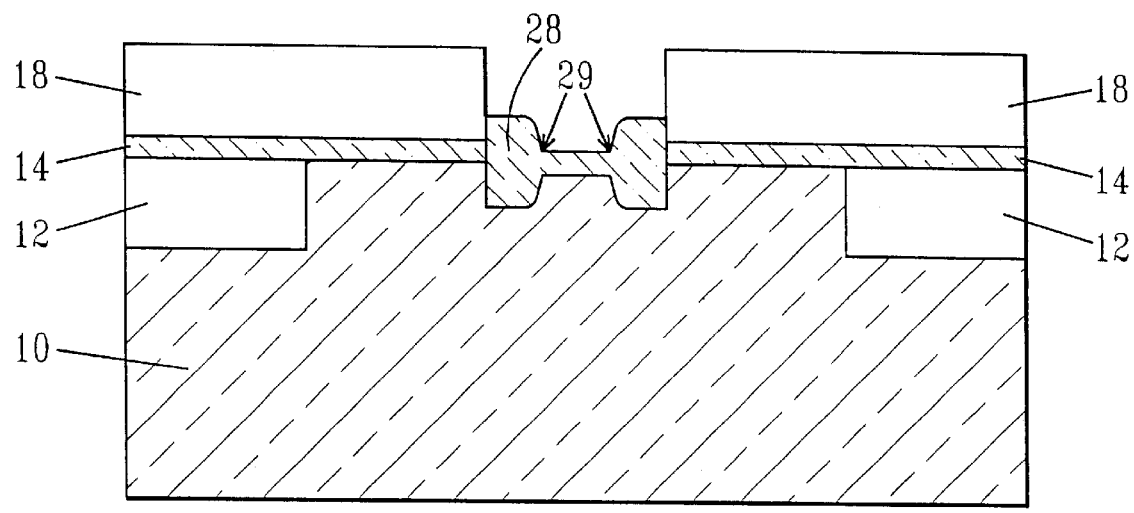

Next, as shown in FIG. 17, the oxide layer (and, if present, the optional sacrificial spacers) in the opening is removed by one of the above mentioned etching processes and dielectric layer 28 is formed in the opening as described above. As before, the dielectric has dual thicknesses wherein the thinnest regions are over areas that include the inhibiting regions, or alternatively, when an enhancement species is employed the thinnest region of the dielectric will be in regions that do not contain the enhancement species.

Figure 18:
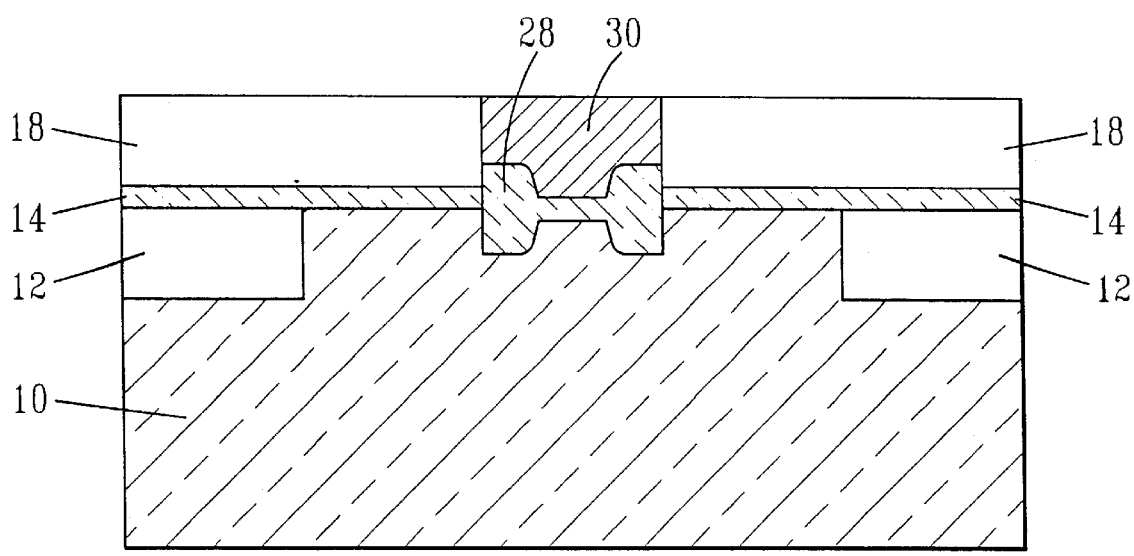
Figure 19:
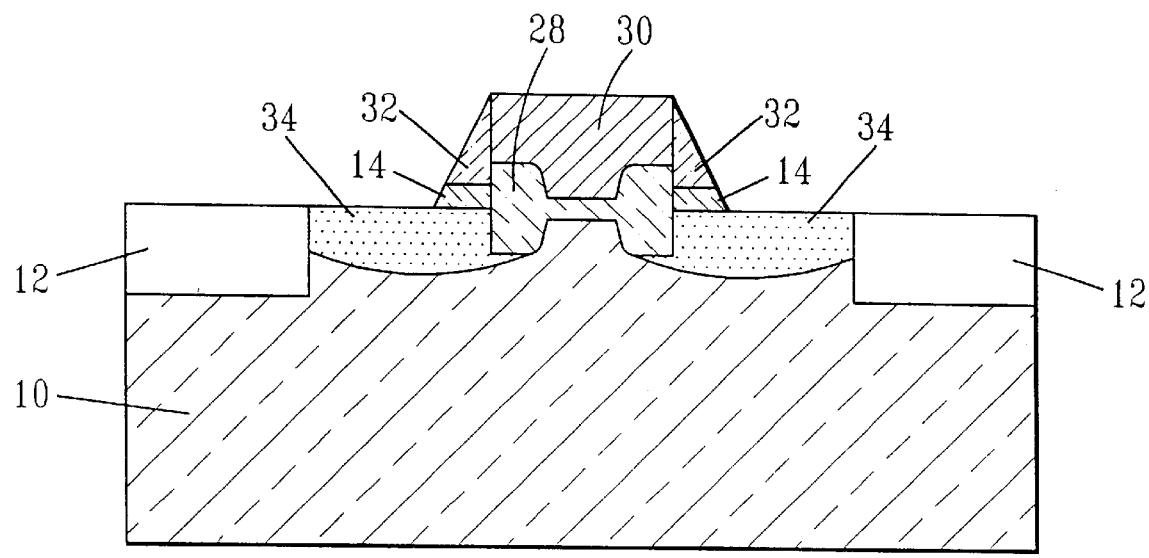

Conductive material 30 is formed in the opening on the dual thickness dielectric layer (see FIG. 18) and the photoresist mask is thereafter stripped. Sidewall spacers 32 are formed on the exterior sidewalls of the gate region and any exposed oxide layer about the gate region is removed utilizing a selective etch process. Diffusion regions 34 are then formed in the substrate providing the structure shown in FIG. 19.

Figure 20:
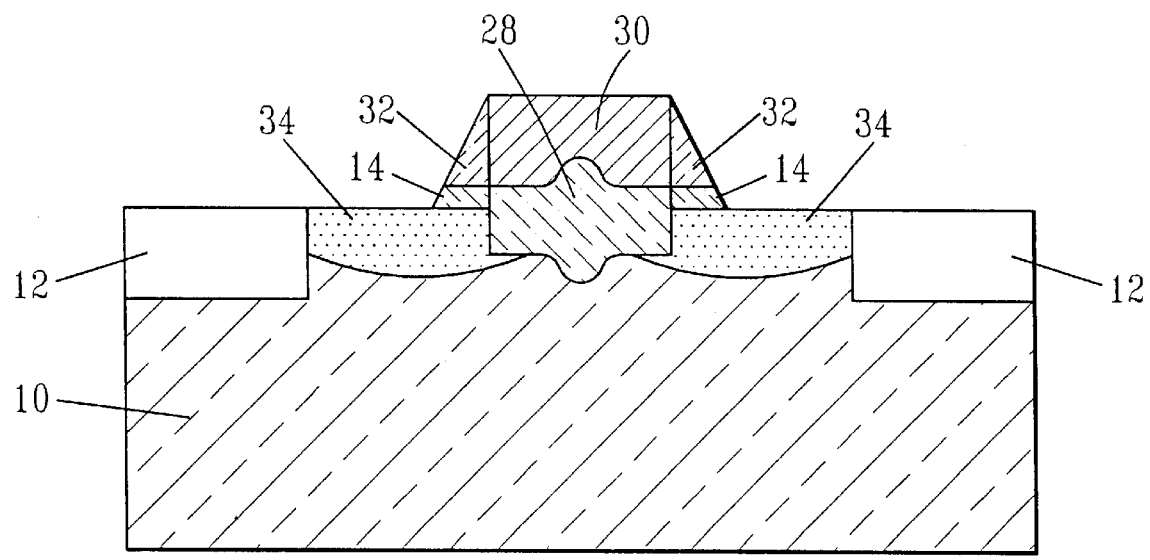
FIG. 20 is a pictorial view illustrating an alternative structure that can be formed by using the method of the present invention in conjunction with a non-damascene processing scheme.

FIG. 20 shows a final structure in which the center portion of the opening has a thicker gate dielectric as compared to the abutting end portions. This structure is formed utilizing the same basic processing steps as illustrated in FIGS. 14–18 except that a portion of the patterned mask remains in the center of the opening during implanting the inhibiting species. This structure shown in FIG. 20 is especially practical for anti-fuse devices where the highest field would be located between the gate and the edge regions which are thinner than the center region. This is important in antifuse devices since the thinner regions can be programmed to control the blowing of the device.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for fabricating a dual thickness dielectric layer in a semiconductor device comprising:
 (a) forming a mask having an opening therethrough on a structure, said o having sidewalls and said structure includes at least a semiconductor substrate having an oxide layer formed thereon;
 (b) implanting an inhibiting species into said structure through the opening so as to form an inhibiting region in said structure; and
 (c) growing a dual thickness dielectric layer on the structure in said opening, wherein the inhibiting region partially inhibits growth of the dielectric layer.

2. The method of claim 1 further comprising a hard mask formed on said oxide layer.

3. The method of claim 1 wherein step (a) includes lithography and etching.

4. The method of claim 1 further comprising forming at least one sacrificial sidewall spacer in said opening on said sidewalls.

5. The method of claim 4 wherein said at least one sacrificial sidewall spacer is formed by deposition and etching.

6. The method of claim 4 wherein two sacrificial sidewall spacers are formed in the opening.

7. The method of claim 4 wherein said at least one sidewall spacer is composed of an oxide, an oxynitride, or a doped silicate glass.

8. The method of claim 7 wherein said at least one sacrificial sidewall spacer is composed of a doped silicate glass and dopant from said doped silicate glass in driven-into the structure by annealing so as to form at least one predoped region.

9. The method of claim 1 further comprising forming a sacrificial oxide layer in said opening prior to conducting step (b).

10. The method of claim 1 wherein said inhibiting species is nitrogen.

11. The method of claim 10 wherein said nitrogen is implanted at an ion dosage of from about $1\times10^{14}$ to about $1\times10^{15}$ atoms/cm$^2$ at an energy of from about 10 to about 30 keV.

12. The method of claim 1 wherein said inhibiting region is formed substantially in the center of said opening.

13. The method of claim 1 wherein said inhibiting region is formed in proximity to at least one sidewall of said opening.

14. The method of claim 1 wherein said inhibiting region is formed in proximity to both sidewalls of said opening and the center of the opening does not contain said inhibiting region.

15. The method of claim 1 wherein said dielectric is an oxide.

16. The method of claim 1 wherein said dielectric is grown by an oxidation process.

17. The method of claim 1 wherein a conductive material is formed on said dielectric layer.

18. The method of claim 1 further comprising (d) a damascene processing scheme.

19. The method of claim 18 wherein said damascene processing scheme includes etch backing utilizing a chemical etchant, spacer formation, oxide removal and diffusion formation.

20. The method of claim 1 further comprising (d) a non-damascene processing scheme.

21. The method of claim 20 wherein said non-damascene processing scheme includes stripping said mask, spacer formation, oxide removal and diffusion formation.

* * * * *